United States Patent
Zhang et al.

(10) Patent No.: US 6,873,527 B2
(45) Date of Patent: Mar. 29, 2005

(54) HEAT TRANSFER APPARATUS

(76) Inventors: Heng Yun Zhang, 11 Science Park Road, Singapore Science Park II, Singapore 117685 (SG); Damaruganath Pinjala, 11 Science Park Road, Singapore Science Park II, Singapore 117685 (SG); Hidetaka Hayashi, 1-5-1, Kiba, Koto-ku, Tokyo 135-8512 (JP); Poh Keong Chan, 20 Science Park Drive, Singapore Science Park I, Singapore 118230 (SG)

( * ) Notice: Subject to any disclaimer, the term of this patent is extended or adjusted under 35 U.S.C. 154(b) by 0 days.

(21) Appl. No.: 10/446,135

(22) Filed: May 28, 2003

(65) Prior Publication Data

US 2004/0012925 A1 Jan. 22, 2004

(30) Foreign Application Priority Data

May 29, 2002 (SG) ......................................... 200203254

(51) Int. Cl.[7] .................................................. H05K 7/20
(52) U.S. Cl. ........................ 361/700; 361/695; 361/699; 361/719; 257/714; 257/715; 174/15.2; 165/80.4
(58) Field of Search ................................. 361/690, 695, 361/699, 700; 175/15.1, 15.2, 16.3; 165/80.4, 104.26; 257/714, 715

(56) References Cited

U.S. PATENT DOCUMENTS

| | | | |
|---|---|---|---|
| 6,111,748 A | 8/2000 | Bhatia | 361/695 |
| 6,122,169 A | 9/2000 | Liu et al. | 361/700 |
| 6,137,681 A * | 10/2000 | Lu | 361/697 |
| 6,148,906 A | 11/2000 | Li et al. | 165/104.33 |
| 6,169,660 B1 * | 1/2001 | Sarraf et al. | 361/717 |
| 6,233,146 B1 | 5/2001 | Gilchrist et al. | 361/687 |
| 6,253,834 B1 | 7/2001 | Sterner | 165/80.3 |
| 6,328,097 B1 * | 12/2001 | Bookhardt et al. | 165/104.33 |
| 6,351,382 B1 * | 2/2002 | Nakanishi et al. | 361/700 |
| 6,373,700 B1 * | 4/2002 | Wang | 361/698 |
| 6,421,239 B1 * | 7/2002 | Huang | 361/696 |
| 6,442,025 B2 * | 8/2002 | Nakamura et al. | 361/695 |
| 6,529,375 B2 * | 3/2003 | Miyahara et al. | 361/697 |
| 6,621,698 B2 * | 9/2003 | Chang | 361/687 |
| 6,654,243 B2 * | 11/2003 | Sheu | 361/687 |
| 6,654,245 B2 * | 11/2003 | Kawashima et al. | 361/695 |
| 6,688,379 B2 * | 2/2004 | Huang et al. | 165/121 |

OTHER PUBLICATIONS

N. Thang et al., Use of Heat Pipe/Heat Sink for Thermal Management of High Performance CPUs, 16th IEEE Semi-Therm Symposium, 2000, pp. 76–79.

* cited by examiner

*Primary Examiner*—Boris Chervinsky
(74) *Attorney, Agent, or Firm*—Nath & Associates PLLC; Harold L. Novick

(57) ABSTRACT

The invention relates to heat transfer apparatus for cooling electronic components. There is a continuously increasing demand for compact electronic systems such as portable laptop computers and thirst for high processing power, leading to high heat generated by components residing within these systems. These electronic systems have to be cooled due to their fixed operating temperature ranges. Operating an electronic component beyond its rated operating temperature range will damage electronic components. Instead of conventionally utilising a bigger fan, a smaller sized solution is required for cooling an electronic component contained in a compact electronic system, for example a notebook computer. A heat transfer apparatus includes a heat carrier for conveying heat away from the electronic system into a radiator for dissipation. The radiator is placed into a cooler for directing air through the radiator and expelling heated air, cooling the radiator in the process.

37 Claims, 5 Drawing Sheets

US 6,873,527 B2

HEAT TRANSFER APPARATUS

FIELD OF INVENTION

The present invention relates generally to a heat transfer apparatus. In particular, the invention relates to a heat transfer apparatus for portable electronic systems.

BACKGROUND

In recent years, there is a continuously increasing demand for compact electronic systems such as portable laptop computers. Coupled with this demand is a need for further miniaturizing of these electronic systems and the thirst for high processing power. Elevating processing power-to-size ratio results in an elevating level of heat generated by these electronic systems. As these electronic systems have fixed operating temperature ranges, the heat generated by these electronic systems limits the extent to which the processing power-to-size ratio can increase. Operating an electronic component beyond its rated operating temperature range can damage the electronic component.

Conventionally, a heat sink is attached to the heat generating electronic component, for example a microprocessor, within the electronic system for conducting heat away from the electronic component. The heat sink typically has a base and an array of fins extending away from the base. The array of fins provides increased surface area that facilitates heat dissipation. A fan can be coupled to the heat sink for improving air circulation around the heat sink. The improved air circulation results in more efficient heat transfer from the heat sink to the surrounding environment.

However, the fan size is limited by the size of the electronic system onto which it is mounted into. The small fan size results in a lower cooling capacity and consequently, lower heat dissipation from the electronic component. Although increasing the amount of fins in the heat sink and the use of a larger fan can substantially improves heat dissipation, the space limitation of these compact electronic systems however constraints such an improvement.

Hence, this clearly affirms a need for an optimised heat transfer apparatus to improve heat dissipation of an electronic component.

SUMMARY

When a substantial amount of heat is generated by an electronic component, for example a microprocessor, a heat sink is used to remove heat away from the electronic component and a large fan is typically used to cool both the electronic component and the heat sink. However, when the electronic component is contained in a compact electronic system, for example a notebook computer, the size of the cooling system used is constrained.

A heat transfer apparatus includes a heat carrier for conveying heat away from the electronic system into a radiator for dissipation. The radiator is placed into a cooler for directing air through the radiator and expelling heated air, cooling the radiator in the process.

Therefore, in accordance with a first aspect of the invention, there is disclosed a heat transfer apparatus for exhausting heat of an electronic component, the heat transfer apparatus comprising:

a heat carrier for receiving heat generated by the electronic component, the heat carrier being thermally coupled to the electronic component;

a radiator for receiving heat conveyed by the heat carrier and for emanating heat into air, the radiator being thermally coupled to the heat carrier; and a cooler comprising:

a chamber in fluid communication with the radiator for providing the passage of air therethrough, the radiator being received in the chamber, wherein heat received in the radiator is dissipated by airflow through the chamber, and the radiator being shaped for generating a substantially straight airflow therealong.

In accordance with a second aspect of the invention, there is disclosed a method for heat transfer and dissipation comprising the steps of:

receiving heat generated by an electronic component into a heat carrier, the heat carrier being thermally coupled to the electronic component;

receiving heat conveyed by the heat carrier into a radiator, the radiator being thermally coupled to the heat carrier;

emanating heat from the radiator into air, and generating airflow through a chamber for dissipating heat received by the radiator, the radiator being disposed within the chamber and the chamber being in fluid communication with the radiator, and the radiator being shaved far generating a substantially straight airflow therealong.

BRIEF DESCRIPTION OF THE DRAWINGS

Embodiments of the invention are described hereinafter with reference to the following drawings, in which.

DETAILED DESCRIPTION

A heat transfer apparatus for addressing the foregoing problems is described hereinafter.

Figure 1:
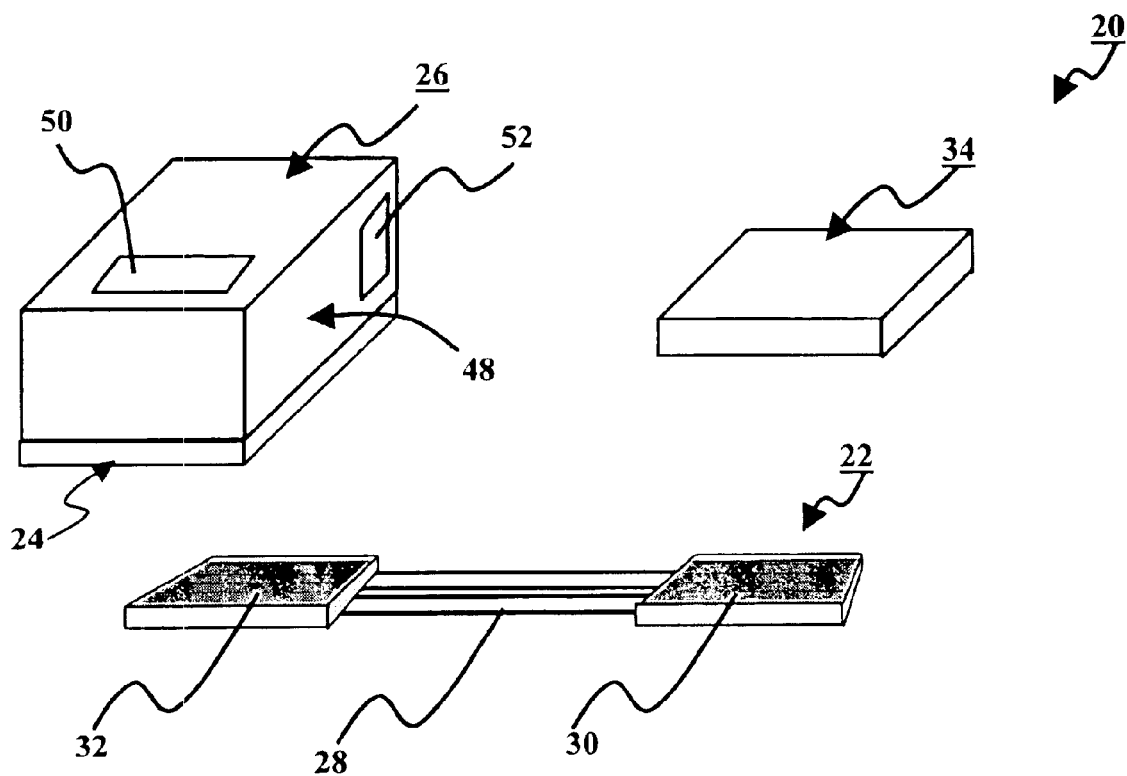
FIG. 1 is a partially exploded perspective view of a heat transfer apparatus according to an embodiment of the invention.

A first embodiment of the invention, a heat transfer apparatus 20 is described with reference to FIG. 1, which shows a partially exploded perspective view of the heat transfer apparatus 20, and FIG. 2, which shows a front view of the heat transfer apparatus 20. The heat transfer apparatus 20 comprises of three main elements: a heat carrier 22, a radiator 24 and a cooler 26, with the radiator 24 being encased by the cooler 26. The heat carrier 22 includes a pair of heat pipes 28 coupled and adjacent to one another, a first heat spreader 30 and a second beat spreader 32. The pair of heat pipes 28 has two distal ends (not shown) with the first heat spreader 30 coupled to one end and the second heat spreader 32 coupled to the other end. The heat pipes 28 are generally flattened for the purpose of space conservation.

The first heat spreader 30 is planar and dimensioned for mounting onto a heat producing electronic component 34, for example a microprocessor mounted on a printed circuit board ('PCB'). The first heat spreader 30 is mounted to the electronic component 34 to reduce conductive resistance. It is preferred that thermal grease be used at the interface of the first heat spreader 30 and the electronic component 34 to improve thermal conductivity. Heat produced by the electronic component 34 is transmitted through the first heat spreader 30 via conduction. Heat received by the first heat spreader 30 is transmitted to the pair of heat pipes 28.

Each heat pipe 28 is an elongated rod with a centrally disposed channel (not shown). The channel is injected with an evaporative fluid (not shown). The evaporative fluid and its vapour circulate in the channel to convey heat from one end of the heat pipe 28 that is warm to the other end of the heat pipe 28 that is cool. Therefore, heat received by the heat pipe 28 from the first heat spreader 30 is conveyed to the second heat spreader 32 in the foregoing manner.

Figure 3:
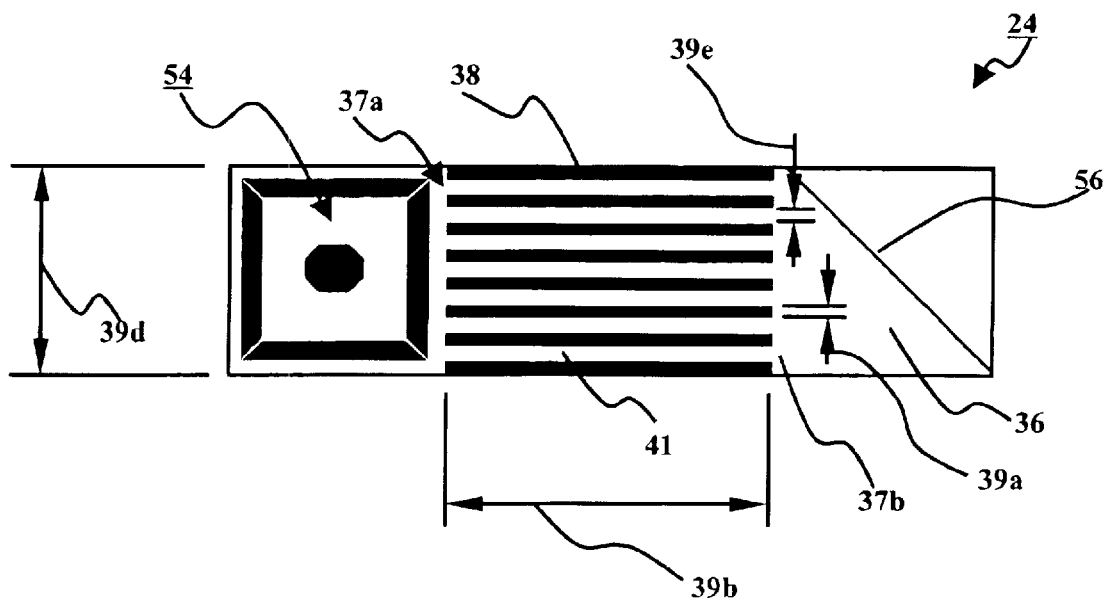
FIG. 3 is a top view of a radiator of the heat transfer apparatus of FIG. 1 with a partial view of a cooler.

FIG. 3 shows a top view of the radiator 24 comprising a base 36 having a first end portion 37a and a second end portion 3b. A plurality of fins 38 protrude from a mid-section of an upper face 40 of the base 36 with the plurality of fins 38 being spaced apart with each fin 38 being parallel to the other fin 38. Each fin 38 is rectangularly shaped, planar and preferably having a thickness 39a of 0.3 mm to 0.9 mm and a length 39b of preferably 30 mm to 60 mm. Passageways 41 are formed between each pair of adjacent fins 38, the passageways 41 extending from the first end portion 37a towards the second end portion 37b of the base 36. The radiator 24 has a width of preferably between 45 mm and 55 mm, the width 39d of the radiator 24 being a distance between the two furthermost fins 38. Each passageway 41 has a fin gap 39e, the fin gap 39e being the general distance between each pair of adjacent fins 38. The ratio of fin gap 39e to fin thickness 39a ranges from and includes 2 to 4.

Figure 4:
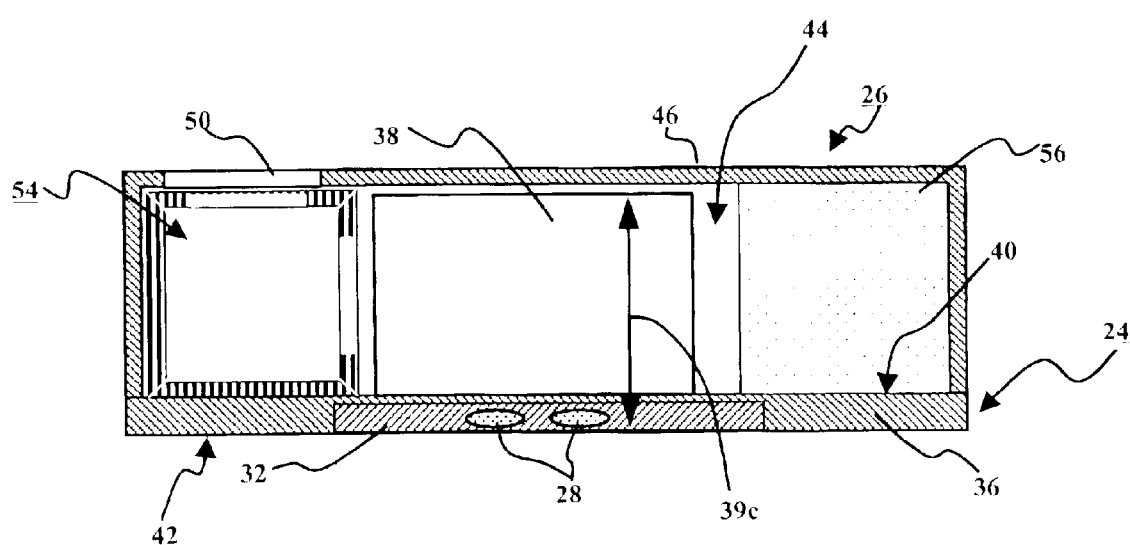
FIG. 4 is a front sectional view of a radiator disposed in a cooler of the heat transfer apparatus in FIG. 1.

The second heat spreader 32 is coupled to a lower face 42 of the base 36. The upper face 40 and the lower face 42 of the base 36 are outwardly opposing as shown in FIG. 4. The interface between the second heat spreader 32 and the base 36 being preferably flush to minimise contact resistance between the base 36 and the second heat spreader 32. The fins 38 then receive heat from the base 36. The array of fins 38 presents a larger surface area that is in contact with air surrounding the fins 38 and between every pair of fins 38. This facilitates radiating of heat from the fins 38 to the atmosphere, cooling the radiator 24 in the process.

The radiator 24 is coupled to the cooler 26, shown in the front sectional view of the cooler 26 in FIG. 4, which has an internally disposed chamber 44 for receiving the array of fins 38 therein, in which the chamber 44 is in fluid communication with the passageways 41 shown in FIG. 3. The cooler 26 is shaped and dimensioned for enclosing the fins 38 and the upper face 40 of the base 36, forming a rectangular-shaped case. The cooler 26 has a top face 46 being inwardly opposite of the lower face 42 and a side wall 48 (as shown an indicated in FIG. 1 depended along a portion of an outer periphery of the cooler 26. It is preferred that each fin 38 protrude a distance of at least 12 mm from the upper face 40 of the base 36 with the base 36 and each fin 38 having a combined height 39c of preferably 15 mm to 25 mm.

A first opening 50 is disposed on the top face 46 of the cooler 26 proximal to the first end portion 37a of the base 36. A second opening 52 is disposed on the side wall 48 of the cooler 26 proximal to the second end portion 37b of the base 36. Air is received into the first opening 50 and expelled from the second opening 52 through the chamber 44.

A fan 54, preferably an axial-type, is disposed in the chamber 44. Alternatively, the fan 54 can be a blower-type.

The fan is disposed on the upper face 40 of the base 36 adjacent to the fins 38 and the first opening 50. The fan 54 draws air through the first opening 50 and channels the air through the passageways 41 between the fins 38. Heat is conveyed from the fins 38 into the air passing through the passageways 41, substantially cooling the fins 38 in the process. The heated air is then expelled through the second opening 52.

A wall 56, also known as a guide, is disposed adjacent to the second opening 52 and the fins 38. The wall 56 disposed within the chamber 44 guides the heated air from the passageways 41 of the fins 38 towards the second opening 52. The wall 56 has a plane that is oblique to the plane of the fins 38. The wall 56 facilitates the expulsion of heated air from the chamber 44 and greatly reduces the heat dissipation capacity of the cooler 26. Facilitating the movement of heated air out from the cooler 26 improves cooling efficiency of the cooler and conveyance of heat away from the electronic component 34.

Figure 2:
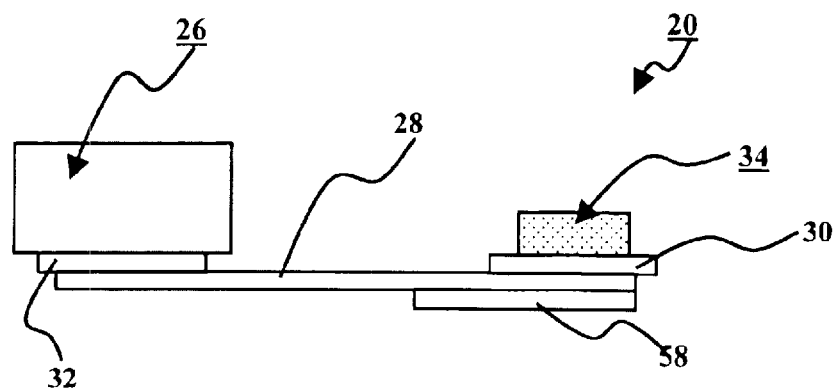
FIG. 2 is a front view of the heat transfer apparatus of FIG. 1.

The heat transfer apparatus 20 is preferably mounted onto a plate 58 to minimise deflection of and consequentially damage to the heat pipes 28 as shown in FIG. 2.

Figure 5:
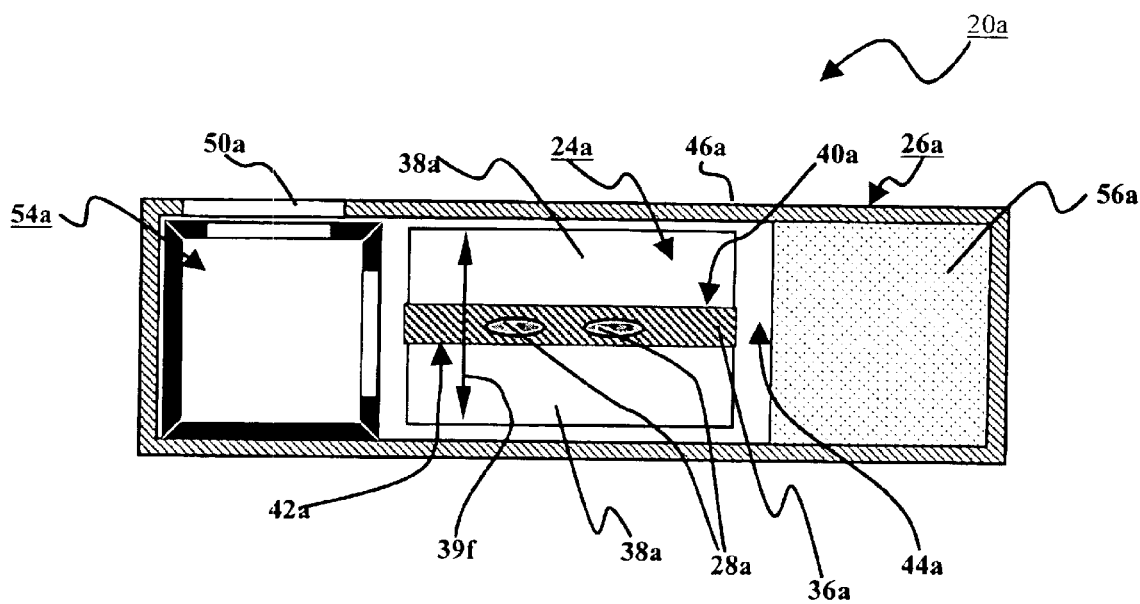
FIG. 5 is a front sectional view of a radiator of the heat transfer apparatus in FIG. 1 enclosed within a pair of coolers.

A second embodiment of the invention, a heat transfer apparatus 20a as seen in FIG. 5, comprises of three main elements: a heat carrier (not shown), a radiator 24a and a cooler 26a. The descriptions in relation to the structural configurations of and positional relationships among the heat pipes 28, the first heat spreader 30, the base 36, the fins 38 and the fan 54 with reference to FIGS. 1 to 5 are incorporated herein, in relation to the equivalent components of the heat transfer apparatus 20a of FIG. 5.

The radiator 24a further includes fins 38a protruding from the lower face 42a, the fins 38a being uniformly spaced apart as shown in a front sectional view of the heat transfer apparatus 20a in FIG. 5. The cooler 26 in the first embodiment of the invention, as shown in FIG. 4, is incorporated in the second embodiment. Referring to FIG. 5, the cooler 26a encloses and cools the fins 38a protruding from both the upper face 40a and the lower face 42a of the base 36a. The cooler 26a includes a chamber 44a, a fan 54a and a wall 56a as described in the first embodiment The dimensions in relation to the thickness 39a of each fin 38a, the length 39b of each fin 38a and the width 39d of the radiator 24a with reference to the first embodiment is incorporated in the second embodiment. However, the combined height 39f of the base 36a and the fins 38a protruding from both the upper face 40a and the lower face 42a of the base 36a is preferably 15 mm to 25 mm.

Instead of coupling the heat pipes 28a to a second heat spreader as in the first embodiment, the heat pipes 28a are received into the base 36a of the radiator 24a.

Figure 6:
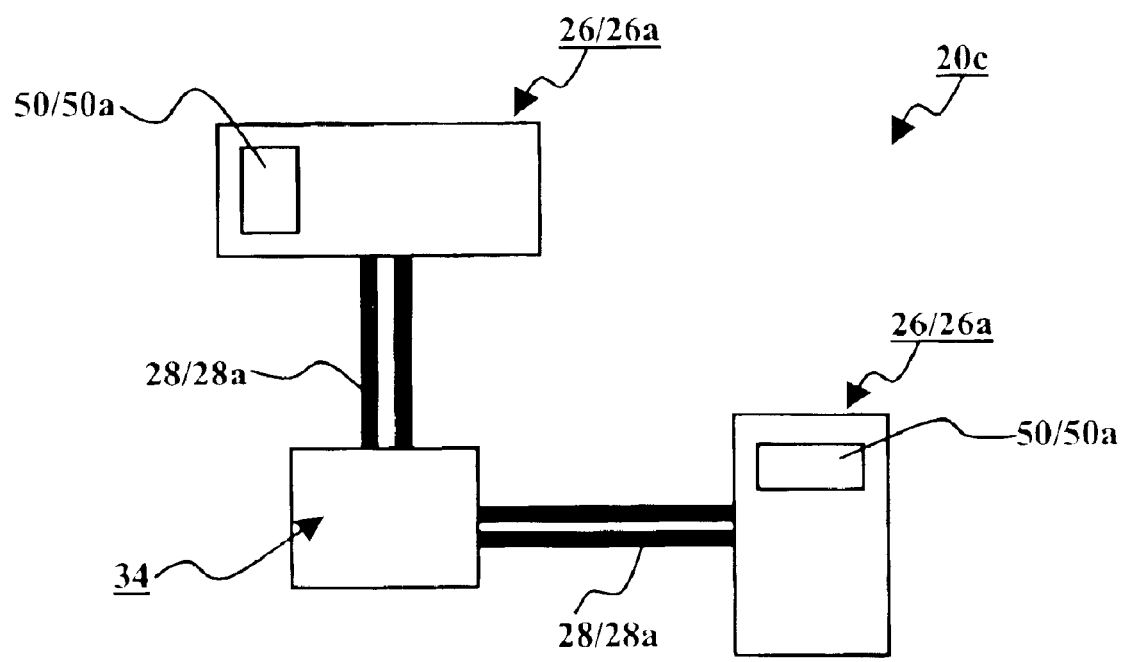
FIG. 6 is a top view of a plurality of the heat transfer apparatus in FIG. 1 with heat carriers sharing a common heat spreader.

A third embodiment of the invention, a heat transfer apparatus 20c as seen in FIG. 6, comprises of three main elements: a heat carrier (not shown), a radiator (not shown) and a cooler 26/26a. The descriptions in relation to the structural configurations of and positional relationships among the heat pipes 28/28a, the first heat spreader 30, the second heat spreader 32, the base 36, the fins 38 and the fan 54 with reference to FIGS. 1 to 5 are incorporated herein.

FIG. 6, shows a top view of the heat transfer apparatus 20c further including a plurality of heat carriers sharing a common first heat spreader. Each heat carrier has a pair of heat pipes 28/28a and a second heat spreader. Each second heat spreader of the heat transfer apparatus 20c is coupled to an independent radiator coupled to an independent cooler 26/26a.

In the foregoing manner, a heat transfer apparatus is described according to three embodiments of the invention for addressing the foregoing disadvantages of conventional heat transfer apparatus. Although only three embodiments of the invention are disclosed, it will be apparent to one skilled in the art in view of this disclosure that numerous changes and/or modification can be made without departing from the scope and spirit of the invention.

What is claimed is:

1. A heat transfer apparatus for exhausting heat of an electronic component, the heat transfer apparatus comprising:
   a heat carrier for receiving heat generated by the electronic component, the heat carrier being thermally coupled to the electronic component;
   a radiator for receiving heat conveyed by the heat carrier and for emanating heat into air, the radiator being thermally coupled to the heat carrier, and the radiator comprising at least one of a plurality of fins extending from an upper face of a base; and
   a cooler comprising:
      a chamber; and a guide disposed adjacent to a first opening formed in fluid communication with the chamber; in fluid communication with the radiator for providing the passage of air therethrough, the radiator being received in the chamber,
   wherein heat received in the radiator is dissipated by airflow through the chamber, and the radiator being shaped for generating a substantially straight airflow therealong.

2. The heat transfer apparatus as in claim 1, the base being coupled to the heat carrier and for providing heat received from the heat carrier to the plurality of fins.

3. The heat transfer apparatus as in claim 2, wherein each fin is rectangularly-shaped, planar and having a thickness within a range of 0.3 mm to 0.9 mm, and the upper face of the base and a lower face of the base being outwardly facing and generally parallel.

4. The heat transfer apparatus as in claim 3, wherein each adjacent pair of fins having a fin gap, the fin gap being the distance between each pair of adjacent fins, and the fin gap and fin thickness having a ratio between the range of two (2) to four (4).

5. The heat transfer apparatus as in claim 4, wherein the fin has a length within a range of 30 mm to 60 mm, the length of the fin being generally parallel to the longitudinal axis of the base.

6. The heat transfer apparatus as in claim 4, wherein the combined height of the fins and the base is within a range of 15 mm to 25 mm, the combined height of the fins and the base being generally perpendicular to the longitudinal axis of the base.

7. The heat transfer apparatus as in claim 4, wherein a distance between the two furthermost fins is within a range of 45 mm to 55 mm.

8. The heat transfer apparatus as in claim 4, wherein a portion of the plurality of fins further extends from the lower face of the base, the fins extending from the upper face being parallel and outwardly opposite of the fins extending from the lower face.

9. The heat transfer apparatus as in claim 2, the cooler comprising an air mover for generating air circulation between any pair of fins.

10. The heat transfer apparatus as in claim 9, the cooler further comprising:
    a second openings and the chamber extending from the first opening to the second opening.

11. The heat transfer apparatus as in claim 10, the:
    guide for directing the flow of air from the chamber into the surroundings,
    wherein the air mover is disposed adjacent to the second opening, the air mover for introducing air surrounding the cooler into the chamber.

12. The heat transfer apparatus as in claim 10, the
    guide for directing the flow of air received into the chamber from the surrounding atmosphere,
    wherein the air mover is disposed proximal to the second opening, the air mover for extracting air from the chamber into the surrounding atmosphere.

13. The heat transfer apparatus as in claim 1, the heat carrier comprising an array of one or more heat pipes, each heat pipe for homogeneously distributing throughout the heat pipe heat concentrated at any portion of the heat pipe.

14. The heat transfer apparatus as in claim 13, the heat carrier further comprising a pair of heat spreaders constituting two ends of the array of heat pipes.

15. The heat transfer apparatus as in claim 14, wherein at least one heat spreader is coupled to one of electronic component or cooler.

16. The heat transfer apparatus as in claim 14, wherein each heat spreader is shaped and sized for substantial contact with one of cooler or electronic component.

17. A method for heat transfer and dissipation comprising the steps of:
    receiving heat generated by an electronic component into a heat carrier, the heat carrier being thermally coupled to the electronic component;
    receiving heat conveyed by the heat carrier into a radiator, the radiator being thermally coupled to the heat carrier, and the radiator comprising at least one of a plurality of fins extending from an upper face of a base;
    emanating heat from the radiator into air; and
    generating airflow through a chamber for dissipating heat received by the radiator, the radiator being disposed within the chamber and the chamber being in fluid communication with the radiator, and the radiator being shaped for generating a substantially straight airflow therealong; and disposing a guide adjacent to a first opening formed in fluid communication with the chamber.

18. The method for heat transfer and dissipation as in claim 17, the base being coupled to the heat carrier and for providing heat received from the heat carrier to the plurality of fins.

19. The method for heat transfer and dissipation as in claim 18, wherein each fin is rectangularly-shaped, planar and having a thickness within a range of 0.3 mm to 0.9 mm, and the upper face of the base and a lower face of the base being outwardly facing.

20. The method for heat transfer and dissipation as in claim 19, wherein each adjacent pair of fins having a fin gap, the fin gap being the distance between each pair of adjacent fins, and the fin gap and fin thickness having a ratio between the range of two (2) to four (4).

21. The method for heat transfer and dissipation as in claim 20, wherein the fin has a length within a range of 30 mm to 60 mm, the length of the fin being generally parallel to the longitudinal axis of the base.

22. The heat transfer apparatus as in claim 20, wherein the combined height of the fins and the base is within a range of 15 mm to 25 mm, the combined height of the fins and the base being generally perpendicular to the longitudinal axis of the base.

23. The method for heat transfer and dissipation as in claim 20, wherein a distance between the two furthermost fins is within a range of 45 mm to 55 mm.

24. The heat transfer apparatus as in claim 20, wherein a portion of the plurality of fins further extends from the lower face of the base, the fins extending from the upper face being parallel and outwardly opposite of the fins extending from the lower face.

25. The method for heat transfer and dissipation as in claim 18, further including the step of generating air circulation between any pair of fins by an air mover, the air mover being coupled to the cooler.

26. The method for heat transfer and dissipation as in claim 25, wherein the base includes a second openings and the chamber extending from the first opening to the second opening.

27. The method for heat transfer and dissipation as in claim 26, further comprising the step of:

directing the flow of air from the chamber into the surroundings using the guide, wherein the air mover is disposed proximal to the second opening, the air mover for introducing air from the surrounding atmosphere into the channel.

28. The method for heat transfer and dissipation as in claim 26, further comprising the step of:

directing the flow of air received into the chamber from the surroundings using the guide, wherein the air mover is disposed adjacent to the second opening, the air mover for extracting air from the chamber into the surrounding atmosphere.

29. The method for heat transfer and dissipation as in claim 17, wherein the heat carrier includes an array of one or more heat pipes, each heat pipe for homogeneously distributing throughout the heat pipe heat concentrated at any portion of the heat pipe.

30. The method for heat transfer and dissipation as in 29, wherein the heat carrier further includes a pair of heat spreaders constituting two ends of the array of heat pipes.

31. The method for heat transfer and dissipation as in claim 30, wherein at least one heat spreader is coupled to one of electronic component or cooler.

32. The method for heat transfer and dissipation as in claim 30, wherein each heat spreader is shaped and sized for substantial contact with one of cooler or electronic component.

33. A heat transfer apparatus for exhausting heat of an electronic component, the heat transfer apparatus comprising: a heat carrier for receiving heat generated by the electronic component, the heat carrier being thermally coupled to the electronic component; a radiator for receiving heat conveyed by the heat carrier and for emanating heat into air, the radiator being thermally coupled to the heat carrier, and the radiator comprising at least one of a plurality of fins extending from an upper face and a lower face of a base; and a cooler comprising: a chamber in fluid communication with the radiator for providing the passage of air therethrough, the radiator being received in the chamber, wherein heat received in the radiator is dissipated by airflow through the chamber, and the radiator being shaped for generating a substantially straight airflow therealong.

34. The heat transfer apparatus as in claim 33, the base being coupled to the heat carrier and for providing heat received from the heat carrier to the plurality of fins, wherein each fin is rectangularly-shaped, planar and having a thickness within a range of 0.3 mm to 0.9 mm, and the upper face of the base and a lower face of the base being outwardly facing and generally parallel.

35. The heat transfer apparatus as in claim 34, wherein each adjacent pair of fins having a fin gap, the fin gap being the distance between each pair of adjacent fins, the fin gap and fin thickness having a ratio between the range of two (2) to four (4), and each fin has a length within a range of 30 mm to 60 mm, the length of the fin being generally parallel to the longitudinal axis of the base.

36. The heat transfer apparatus as in claim 33, the cooler further comprising: a pair of openings and the chamber extending from one opening to the other opening; and a guide for directing the flow of air from the chamber into the surroundings, wherein the guide is disposed adjacent to one opening and an air mover is disposed adjacent to the other opening, the air mover for introducing air surrounding the cooler into the chamber.

37. The heat transfer apparatus as in claim 33, the cooler further comprising: a pair of openings and the chamber extending from one opening to the other opening; and a guide for directing the flow of air received into the chamber from the surrounding atmosphere, wherein the guide is disposed adjacent to one opening and an air mover is disposed proximal to the other opening, the air mover for extracting air from the chamber into the surrounding atmosphere.

* * * * *